US012666999B2

(12) United States Patent
Matsumoto

(10) Patent No.: US 12,666,999 B2
(45) Date of Patent: Jun. 23, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Takayuki Matsumoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 424 days.

(21) Appl. No.: 18/557,785

(22) PCT Filed: Jul. 5, 2021

(86) PCT No.: PCT/JP2021/025264
§ 371 (c)(1),
(2) Date: Oct. 27, 2023

(87) PCT Pub. No.: WO2023/281562
PCT Pub. Date: Jan. 12, 2023

(65) Prior Publication Data
US 2024/0222206 A1     Jul. 4, 2024

(51) Int. Cl.
*H10W 76/63*        (2026.01)
*H10W 40/20*        (2026.01)
(Continued)

(52) U.S. Cl.
CPC ........... *H10W 76/63* (2026.01); *H10W 76/15* (2026.01); *H10W 76/17* (2026.01); *H10W 76/67* (2026.01);
(Continued)

(58) Field of Classification Search
CPC . H01L 23/06; H01L 25/072; H01L 2023/405; H01L 23/36; H01L 23/4006;
(Continued)

(56) References Cited

U.S. PATENT DOCUMENTS 5,920,119 A * 7/1999 Tamba ................... H01L 25/18
257/726
6,521,983 B1 * 2/2003 Yoshimatsu .......... H01L 25/072
257/E25.031
(Continued)

FOREIGN PATENT DOCUMENTS

CN          103430306 A  * 12/2013   ....... H01L 21/76838
CN          106449531 A  *  2/2017   .............. H05K 1/18
(Continued)

OTHER PUBLICATIONS

International Search Report issued in PCT/JP2021/025264; mailed Aug. 31, 2021.

*Primary Examiner* — Earl N Taylor
(74) *Attorney, Agent, or Firm* — Studebaker Brackett PLLC

(57)          ABSTRACT

A semiconductor device includes: a heat radiation plate; an insulating substrate disposed on an upper surface of the heat radiation plate; a semiconductor element mounted to an upper surface of the insulating substrate; a frame-like resin case disposed in a peripheral edge portion of the upper surface of the heat radiation plate and extending in an up-down direction to surround a lateral surface of each of the insulating substrate and the semiconductor element; and a resin bonded member formed to be detachable from the resin case as a separate body separated from the resin case and bonded to the heat radiation plate while being attached to the resin case. Formed in the bonded member is a screw hole to which a screw is screwed to bond the bonded member to the heat radiation plate.

7 Claims, 10 Drawing Sheets

(51) Int. Cl.

| | |
|---|---|
| *H10W 40/60* | (2026.01) |
| *H10W 76/15* | (2026.01) |
| *H10W 76/17* | (2026.01) |
| *H10W 76/67* | (2026.01) |
| *H10W 90/10* | (2026.01) |

(52) U.S. Cl.
CPC .......... *H10W 90/10* (2026.01); *H10W 40/235* (2026.01); *H10W 40/611* (2026.01)

(58) Field of Classification Search
CPC ....... H01L 23/053; H01L 23/10; H01L 25/18; H10W 78/00; H10W 76/63; H10W 40/611; H10W 40/60; H10W 76/60; H10W 76/17; H10W 90/00; H10W 40/235
See application file for complete search history.

(56) References Cited

U.S. PATENT DOCUMENTS

| | | | | |
|---|---|---|---|---|
| 2016/0322278 | A1* | 11/2016 | Sawagashira ....... | H01L 23/4006 |
| 2017/0170096 | A1 | 6/2017 | Hironaka et al. | |
| 2017/0301604 | A1* | 10/2017 | Ueda ................... | H01S 5/02469 |
| 2018/0358280 | A1* | 12/2018 | Gandhi .............. | H01L 23/3675 |
| 2019/0057914 | A1* | 2/2019 | Nakahara ............. | H01L 23/053 |

FOREIGN PATENT DOCUMENTS

| | | | | | |
|---|---|---|---|---|---|
| CN | 107818955 | A | * | 3/2018 | ............. H01L 23/04 |
| JP | 2006032392 | A | * | 2/2006 | |
| WO | 2016/006065 | A1 | | 1/2016 | |

* cited by examiner

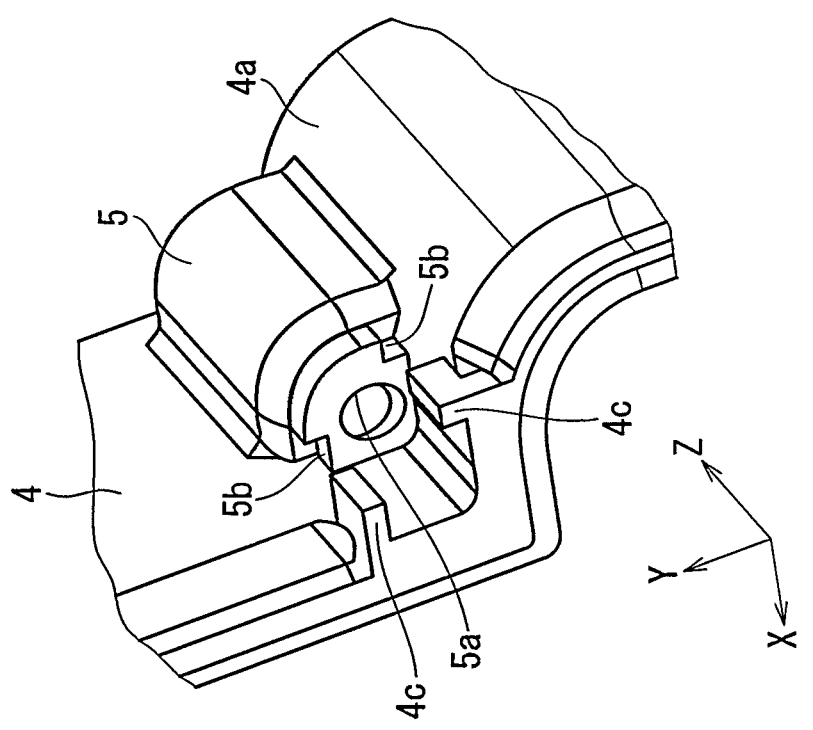

Y
Z
X

FIG. 10
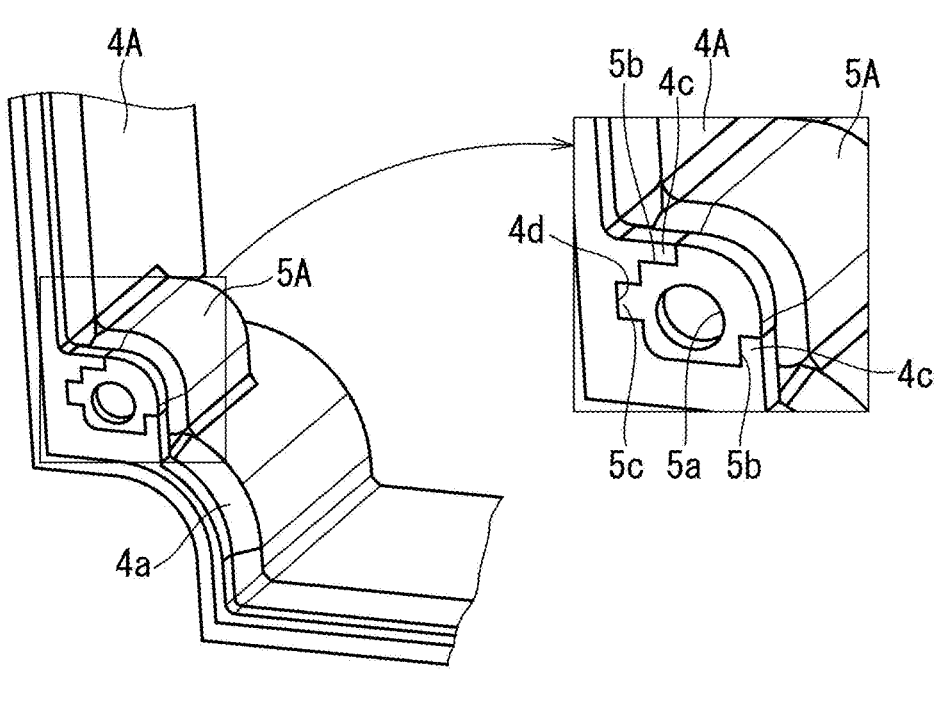
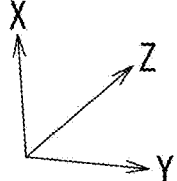

SEMICONDUCTOR DEVICE AND METHOD OF MANUFACTURING SEMICONDUCTOR DEVICE

TECHNICAL FIELD

The present disclosure relates to a semiconductor device and a method of manufacturing the semiconductor device.

BACKGROUND ART

Conventionally, in a semiconductor device having a case type structure, a base plate (corresponding to a heat radiation plate) having heat radiation properties and a case (corresponding to a resin case) molded by resin, for example, to house a semiconductor chip (corresponding to a semiconductor element) are bonded by a metal screw from a viewpoint of assemblability and bonding strength, for example (refer to Patent Document 1, for example).

PRIOR ART DOCUMENTS

Patent Document(s)

Patent Document 1: International Publication No. 2016/006065

SUMMARY

Problem to be Solved by the Invention

However, in manufacturing the semiconductor device having the conventional case type structure, the resin case is wholly molded at the same time, thus molding voids easily occur in a thick molding part of the resin case. Herein, the thick molding part of the resin case is located around a screw hole to which a screw for being bonded to the heat radiation plate is screwed. Thus, there is a problem that molding voids occurring around the screw hole formed in the resin case causes various defects.

Accordingly, an object of the present disclosure is to provide a technique capable of suppressing occurrence of molding voids in a resin molding body such as a resin case in a semiconductor device.

Means to Solve the Problem

A semiconductor device according to the present disclosure includes: a heat radiation plate; an insulating substrate disposed on an upper surface of the heat radiation plate; a semiconductor element mounted to an upper surface of the insulating substrate; a frame-like resin case disposed in a peripheral edge portion of the upper surface of the heat radiation plate and extending in an up-down direction to surround a lateral surface of each of the insulating substrate and the semiconductor element; and a resin bonded member formed to be detachable from the resin case as a separate body separated from the resin case and bonded to the heat radiation plate while being attached to the resin case, wherein formed in the bonded member is a screw hole to which a screw is screwed to bond the bonded member to the heat radiation plate.

Effects of the Invention

According to the present disclosure, the bonded material including the screw hole is molded as the separated body separated from the resin case, thus a volume of the bonded material is reduced compared with a volume of a resin case in a case where a screw hole is formed in the resin case. Accordingly, resin easily fills the bonded member and influence of a heat shrinkage on the bonded member is also reduced, thus molding voids occurring in the bonded member are significantly suppressed.

In the meanwhile, the screw hole as the thick molding part is not formed in the resin case, thus molding voids occurring in the resin case are also significantly suppressed. As described above, occurrence of the molding voids in the resin case as the resin molding body and the bonded member can be suppressed.

These and other objects, features, aspects and advantages of the present disclosure will become more apparent from the following detailed description when taken in conjunction with the accompanying drawings.

BRIEF DESCRIPTION OF DRAWINGS

FIGS. 4A and 4B are perspective views of a process of attaching a bonded member to the resin case seen from the bottom surface side.

FIG. 10 is a perspective view of the bonded member attached to the resin case seen from the bottom surface side and an enlarged view of a part surrounded by a solid line.

DESCRIPTION OF EMBODIMENT(S)

Embodiment 1

<Configuration of Semiconductor Device>

Figure 1:
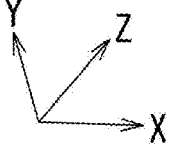
FIG. 1 is an exploded perspective view of a semiconductor device according to an embodiment 1.
Figure 2:
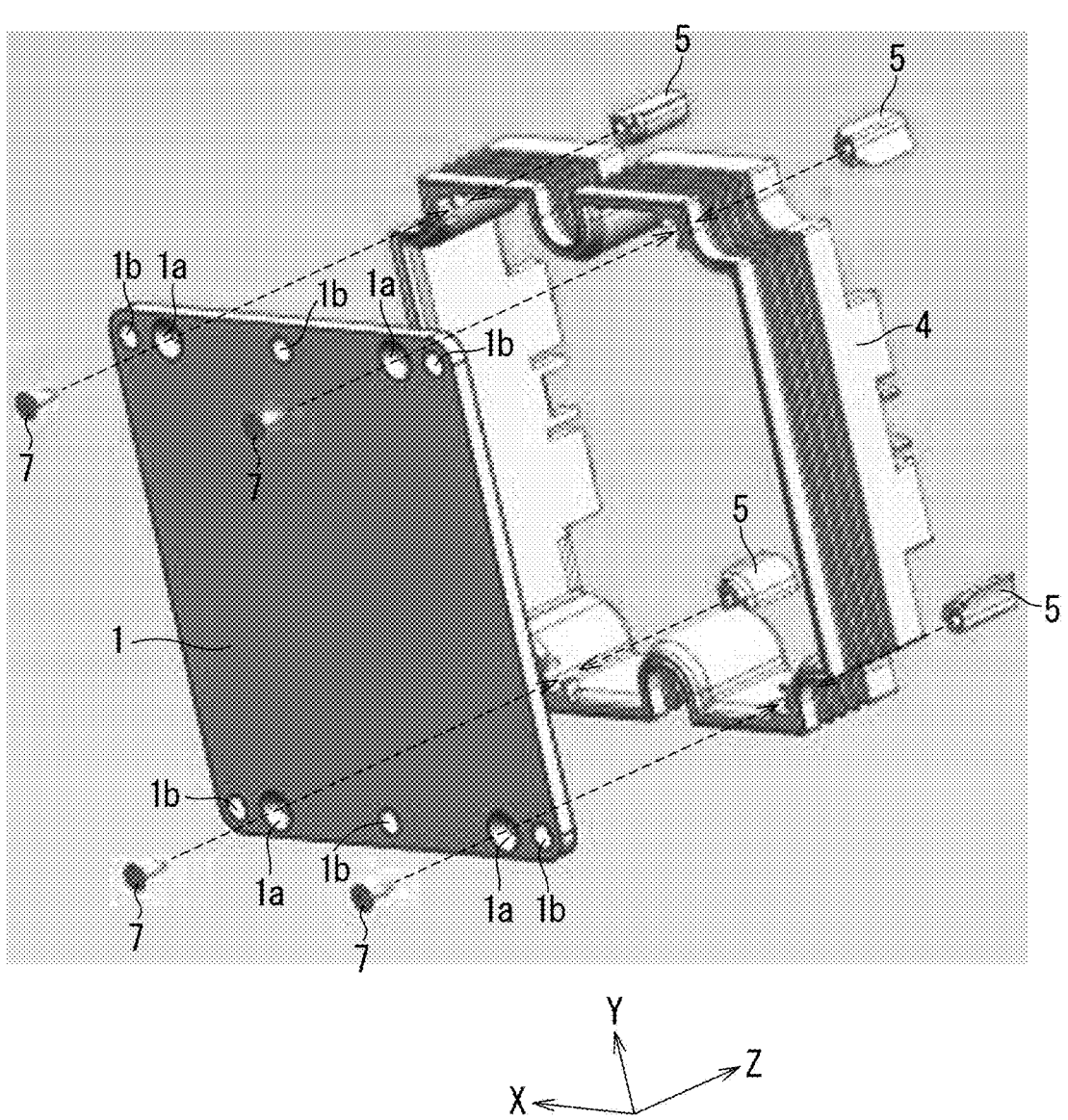
FIG. 2 is an exploded perspective view of the semiconductor device according to the embodiment 1 seen from a bottom surface side.

An embodiment 1 is described hereinafter using the drawings. FIG. 1 is an exploded perspective view of a semiconductor device according to the embodiment 1. FIG. 2 is an exploded perspective view of the semiconductor device according to the embodiment 1 seen from a bottom surface side.

In FIG. 1, an X direction, a Y direction, and a Z direction are perpendicular to each other. An X direction, a Y direction, and a Z direction illustrated in the subsequent drawings are also perpendicular to each other. In the description hereinafter, a direction including the X direction and a −X direction as a direction opposite to the X direction is also referred to as "an X axis direction". In the description hereinafter, a direction including the Y direction and a −Y direction as a direction opposite to the Y direction is also referred to as "a Y axis direction". In the description hereinafter, a direction including the Z direction and a –Z direction as a direction opposite to the Z direction is also referred to as "a Z axis direction".

As illustrated in FIG. 1 and FIG. 2, the semiconductor device includes a heat radiation plate 1, an insulating substrate 2, a plurality of semiconductor elements 3, a resin case 4, and four bonded members 5.

The heat radiation plate 1 is a metal plate made of copper and AlSiC, for example, having high thermal conductivity. The heat radiation plate 1 is formed into a rectangular shape in a top view (seen from a Z direction), and a through hole 1b through which a screw (not shown) for fixing the semiconductor device to an external apparatus (not shown) is inserted is formed in four corner parts of the heat radiation plate 1 and a central part of each of two sides extending in an X axis direction. A through hole 1a through which a screw 7 for bonding the heat radiation plate 1 and the bonded member 5 is inserted is formed in a part closer to a center in the X axis direction in relation to the through hole 1b formed in each of the four corner parts of the heat radiation plate 1.

The insulating substrate 2 is made up of an insulating material, and is disposed in a region closer to an inner periphery side in relation to a peripheral edge portion of an upper surface (surface in the Z direction) of the heat radiation plate 1. The plurality of semiconductor elements 3 are mounted to an upper surface (surface in the Z direction) of the insulating substrate 2. The semiconductor element 3 is a switching element and a diode element, and includes silicon. The semiconductor element 3 may include wide bandgap semiconductor. Silicon carbide, gallium nitride, and diamond are applied as the wide bandgap semiconductor. The number of semiconductor elements 3 is not limited to two or more, but one semiconductor element 3 is also applicable.

The resin case 4 is made up of resin as an insulating material. The resin case 4 is disposed on an adhesive agent 6 applied to the peripheral edge portion of the upper surface (surface in the Z direction) of the heat radiation plate 1, and is formed into a frame-like shape extending in an up-down direction (Z axis direction) to surround a lateral surface of each of the insulating substrate 2 and the semiconductor element 3 (surface in the X axis direction and a Y axis direction). Four curved parts 4a each concaved to an inner periphery side to have a curved shape are formed in four corner parts of the resin case 4, respectively. Each of two curved parts 4b concaved to an inner periphery side to have a curved shape is formed in a central part of each of two sides extending in the X axis direction in the resin case 4.

Each bonded material 5 is made up of resin as an insulating material. Each bonded member 5 is formed to be detachable from the resin case 4 as a separate body separated from the resin case 4, and is bonded to the heat radiation plate 1 by the screw 7 while being attached to the resin case 4.

Figure 3:
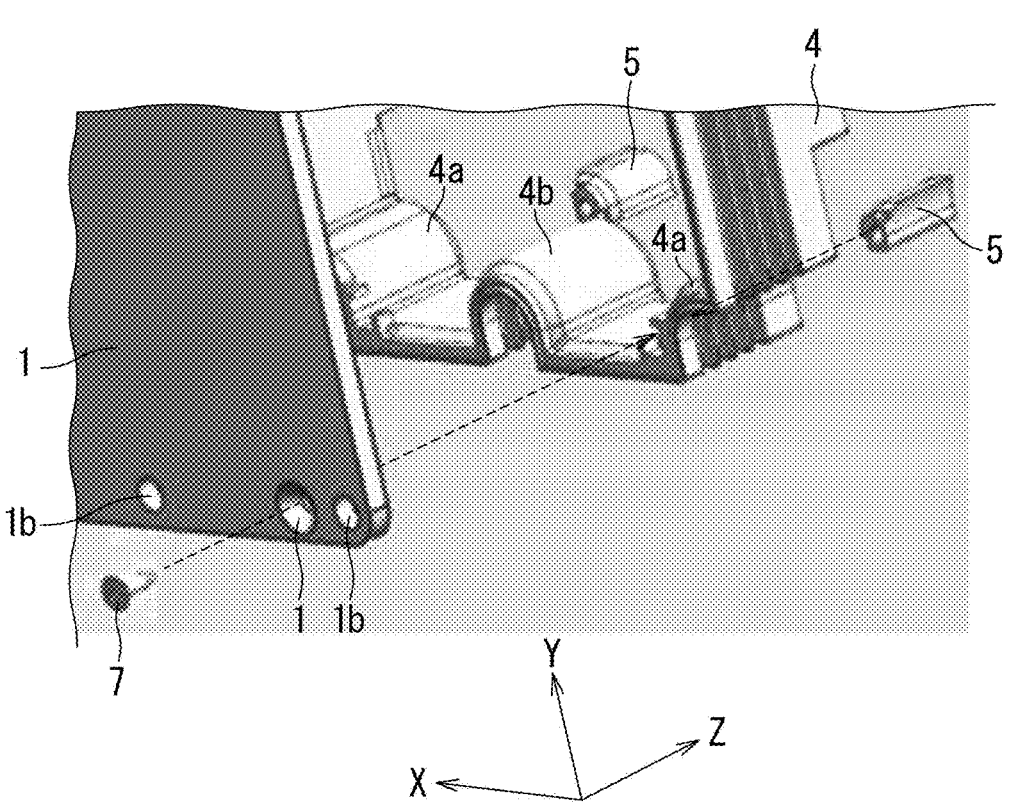
FIG. 3 is an enlarged view of a position where a heat radiation plate and a resin case are bonded to each other in FIG. 2.

Described next is a structure that each bonded member 5 is detachable from the resin case 4. FIG. 3 is an enlarged view of a position where the heat radiation plate 1 and the resin case 4 are bonded to each other in FIG. 2. FIGS. 4A and 4B are perspective views of a process of attaching the bonded member 5 to the resin case 4 seen from the bottom surface side (surface side in the –Z direction). Specifically, FIG. 4A is a perspective view of the bonded member 5 before being attached to the resin case 4 seen from the bottom surface side (surface side in the –Z direction). FIG.

4B is a perspective view of the bonded member 5 attached to the resin case 4 seen from the bottom surface side (surface side in the –Z direction).

As illustrated in FIG. 3 and FIGS. 4A and 4B, a pair of convex parts 4c protruding to an inner periphery side are formed in an inner peripheral surface of each of four corner parts in the resin case 4. Specifically, the pair of convex parts 4c are formed in positions sandwiching a boundary line between the curved part 4a and two sides extending in the X axis direction in a lower end portion (end portion in the –Z direction) of the resin case 4.

The bonded member 5 is formed into a columnar shape extending in the up-down direction (Z axis direction), and includes a screw hole 5a communicated with the through hole 1a of the heat radiation plate 1. The screw hole 5a extends from a bottom surface (surface in the –Z direction) to a midway portion of an upper side (Z direction). A surface on an inner periphery side of the bonded member 5 is a curved surface, and a surface on an outer periphery side thereof is made up of two surfaces perpendicular to each other. A pair of concave parts 5b fitted to the pair of convex parts 4c are formed in an outer peripheral part of a lower end portion (end portion in the –Z direction) of the bonded member 5.

Specifically, the pair of concave parts 5b are formed in two surfaces on the outer periphery side of the bonded member 5, respectively. The pair of concave parts 5b are fitted to the pair of convex parts 4c, respectively, thus the bonded member 5 is attached to surrounding parts of the corner parts of the resin case 4. The pair of convex parts 4c are formed in the resin case 4, and the pair of concave parts 5b are formed in the bonded member 5, thus achieved is a structure that a part of the bonded member 5 does not protrude to the outer periphery side of the resin case 4 at the time of fitting the pair of concave parts 5b to the pair of convex parts 4c.

The screw 7 is inserted into the through hole 1a of the heat radiation plate 1 from the bottom surface side (surface side in the –Z direction) of the heat radiation plate 1 while the bonded member 5 is attached to the resin case 4, and is screwed to the screw hole 5a of the bonded member 5, thus the heat radiation plate 1 and the bonded member 5 are bonded to each other. Accordingly, the heat radiation plate 1 and the resin case 4 are bonded via the bonded member 5.

The bonded member 5 is molded as the separate body separated from the resin case 4, thus a volume of the bonded member 5 is reduced compared with a volume of the resin case where the screw hole is formed. Accordingly, resin easily fills the bonded member 5 and influence of a heat shrinkage on the bonded member 5 is also reduced, thus molding voids occurring in the bonded member 5 is significantly suppressed. In the meanwhile, the screw hole as the thick molding part is not formed in the resin case 4, thus molding voids occurring in the resin case 4 are also significantly suppressed.

In the above description, the pair of the convex parts 4c are formed in the resin case 4, and the pair of concave parts 5b are formed in the bonded member 5, however, it is also applicable that a pair of concave parts are formed in the resin case 4, and a pair of convex parts are formed in the bonded member 5. In the above description, the screw hole 5a extends from the bottom surface (surface in the –Z direction) of the bonded member 5 to the midway portion of the upper side (Z direction), but may pass through the bonded member 5 to extend from the bottom surface (surface in the –Z direction) of the bonded member 5 to the upper surface thereof (surface in the Z direction).

Figures 5A, 5B, 5C:
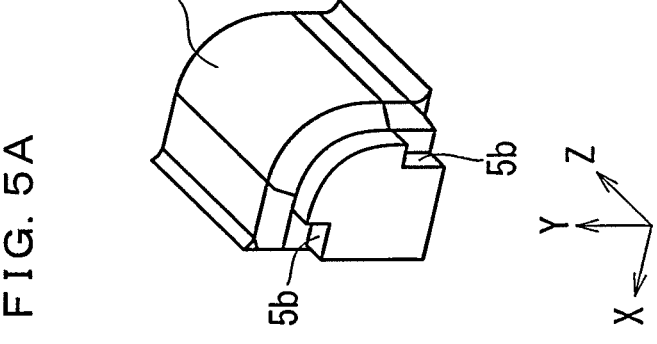
FIGS. 5A to 5C are perspective views of a process of forming a screw hole in the bonded member seen from the bottom surface side.

FIGS. 5A to 5C are perspective views of a process of forming the screw hole 5a in the bonded member 5 seen from the bottom surface side (surface side in the −Z direction). Specifically, FIG. 5A is a perspective view of the bonded member 5 before the screw hole 5a is formed seen from the bottom surface side (surface side in the −Z direction). FIG. 5B is a perspective view of expression of the screw hole 5a formed in the bonded member 5 seen from the bottom surface side (surface side in the −Z direction). FIG. 5C is a perspective view of the bonded member 5 in which the screw hole 5a is formed seen from the bottom surface side (surface side in the −Z direction).

The screw hole 5a may be formed in molding the bonded member 5, or may also be formed by machine processing after molding the bonded member 5 as illustrated in FIGS. 5A to 5C.

<Method of Manufacturing Semiconductor Device>

Figure 6:
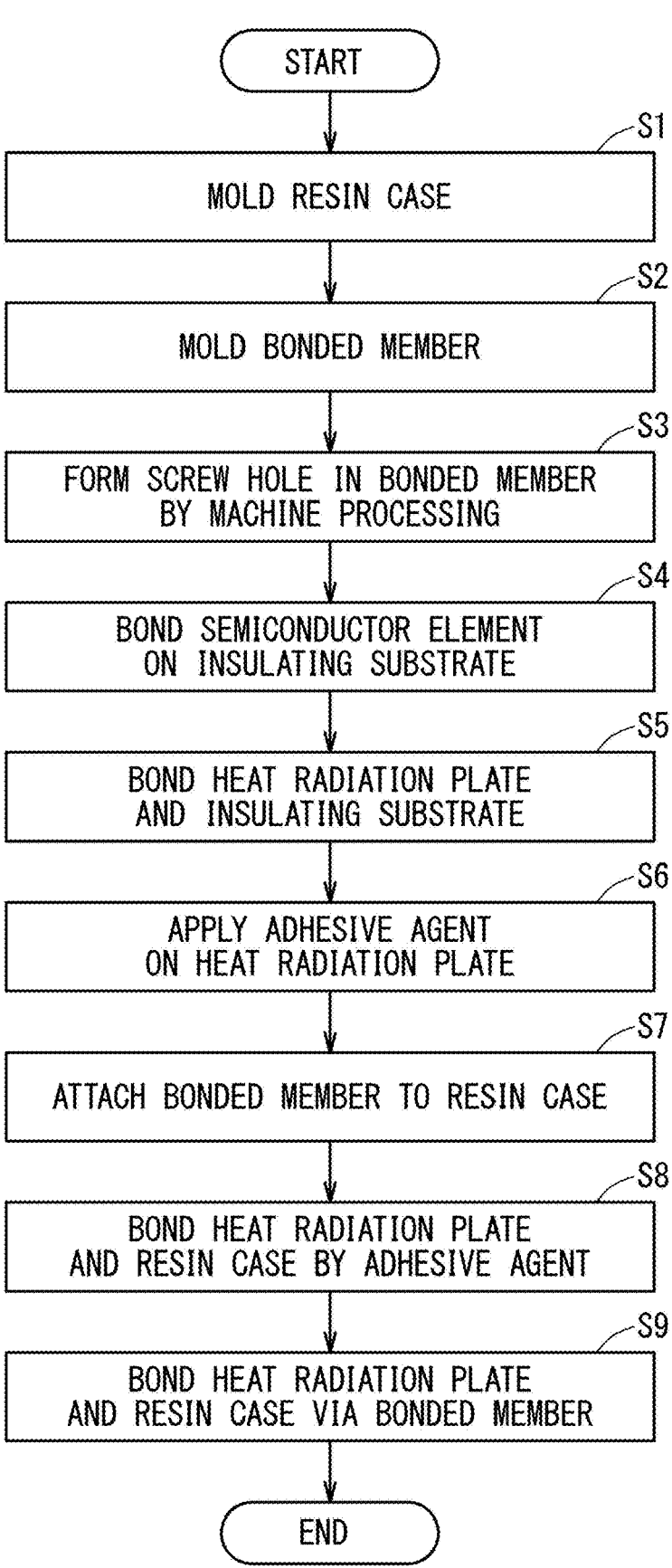
FIG. 6 is a flow chart illustrating a method of manufacturing a semiconductor device.

A method of manufacturing a semiconductor device is described next. FIG. 6 is a flow chart illustrating the method of manufacturing the semiconductor device. Described herein is a case of forming the screw hole Sa after molding the bonded member 5.

As illustrated in FIG. 6, the resin case 4 is molded firstly (Step S1). Next, the bonded member 5 with no screw hole 5a is molded (Step S2). The resin case 4 and the bonded member 5 are molded using molds different from each other, thus these processes may be performed at the same time, or the resin case 4 may be molded after molding the bonded member 5.

Next, the screw hole 5a is formed in the bonded member 5 by machine processing (Step S3). After the semiconductor element 3 is bonded on the insulating substrate 2 by a bonding material (not shown) (Step S4), the insulating substrate 2 is bonded to an upper surface (surface in the Z direction) of the heat radiation plate 1 by a bonding material (not shown) (Step S5). Then, the adhesive agent 6 is applied to a peripheral edge portion of the upper surface (surface in the Z direction) of the heat radiation plate 1 (Step S6).

After the bonded member 5 is attached to the resin case 4 (Step S7), the resin case 4 is disposed on the adhesive agent 6 applied on the heat radiation plate 1, and the heat radiation plate 1 and the resin case 4 are bonded by the adhesive agent 6 (Step S8).

The screw 7 is inserted into the through hole 1a of the heat radiation plate 1 from the bottom surface side (surface side in the −Z direction) of the heat radiation plate 1 while the bonded member 5 is attached to the resin case 4, and is screwed to the screw hole 5a of the bonded member 5, thus the heat radiation plate 1 and the bonded member 5 are bonded by the screw 7. Accordingly, the heat radiation plate 1 and the resin case 4 are bonded via the bonded member 5 (Step S9).

<Effect>

As described above, the semiconductor device according to the embodiment 1 includes: the heat radiation plate 1; the insulating substrate 2 disposed on the upper surface (surface in the Z direction) of the heat radiation plate 1; the semiconductor element 3 mounted to the upper surface (surface in the Z direction) of the insulating substrate 2; the frame-like resin case 4 disposed in the peripheral edge portion of the upper surface (surface in the Z direction) of the heat radiation plate 1 and extending in the up-down direction (Z axis direction) to surround the lateral surface (surface in the X direction and the Y direction) of each of the insulating substrate 2 and the semiconductor element 3; and the resin bonded member 5 formed to be detachable from the resin case 4 as a separate body separated from the resin case 4 and bonded to the heat radiation plate 1 while being attached to the resin case 4, wherein formed in the bonded member 5 is the screw hole 5a to which the screw 7 is screwed to bond the bonded member 5 to the heat radiation plate 1.

The bonded material 5 including the screw hole Sa is molded as the separated body separated from the resin case 4, thus the volume of the bonded material 5 is reduced compared with the volume of the resin case in the case where the screw hole is formed in the resin case. Accordingly, resin easily fills the bonded member 5 and influence of the heat shrinkage on the bonded member 5 is also reduced, thus the molding voids occurring in the bonded member 5 is significantly suppressed.

In the meanwhile, the screw hole as the thick molding part is not formed in the resin case 4, thus the molding voids occurring in the resin case 4 are also significantly suppressed. As described above, occurrence of the molding voids in the resin case 4 as the resin molding body and the bonded member 5 can be suppressed.

The convex part 4c protruding to the inner periphery side is formed in the inner peripheral surface of the resin case 4, and the concave part 5b fitted to the convex part 4c is formed in the outer peripheral part of the bonded member 5. Accordingly, protrusion of a part of the bonded member 5 to the outer periphery side of the resin case 4 can be suppressed in fitting the concave part 5b and the convex part 4c.

The semiconductor element 3 includes the wide bandgap semiconductor, thus the semiconductor device can be operated at high temperature. When the resin case 4 includes the molding voids in an operation at high temperature, partial discharge occurs and leads to insulation breakdown, however, the semiconductor device according to the embodiment 1 can suppress the occurrence of the molding voids, thus the occurrence of the partial discharge caused by expansion of the molding voids in the operation at high temperature is suppressed, and insulation capacity is improved. The wide bandgap semiconductor is adopted to the semiconductor element 3, thus the semiconductor element 3 can be downsized, and downsizing of the semiconductor device can be achieved by space saving.

The method of manufacturing the semiconductor device according to the embodiment 1 includes the step (a) of molding the resin case 4; the step (b) of molding the bonded member 5 as the separate body separated from the resin case 4; the step (c) of forming the screw hole 5a in the bonded member 5 by the machine processing; the step (d) of attaching the bonded member 5 to the resin case 4; and the step (e) of bonding the heat radiation plate 1 and the bonded member 5 with the screw 7, thereby bonding the heat radiation plate 1 and the resin case 4.

The bonded member 5 is molded while the screw hole 5a is not formed, thus the structure of the bonded member 5 is simplified as the resin molding body compared with the case of being molded while the screw hole Sa is formed. Thus, a filling rate of the resin in the bonded member 5 is increased, and the molding voids occurring in the bonded member 5 can be further suppressed.

Embodiment 2

<Configuration of Semiconductor Device>

Figure 7:
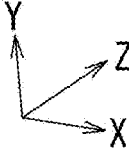
FIG. 7 is a exploded perspective view of a semiconductor device according to an embodiment 2.
Figure 8:
FIG. 8 is a exploded perspective view of the semiconductor device according to the embodiment 2 seen from a bottom surface side.
Figure 9:
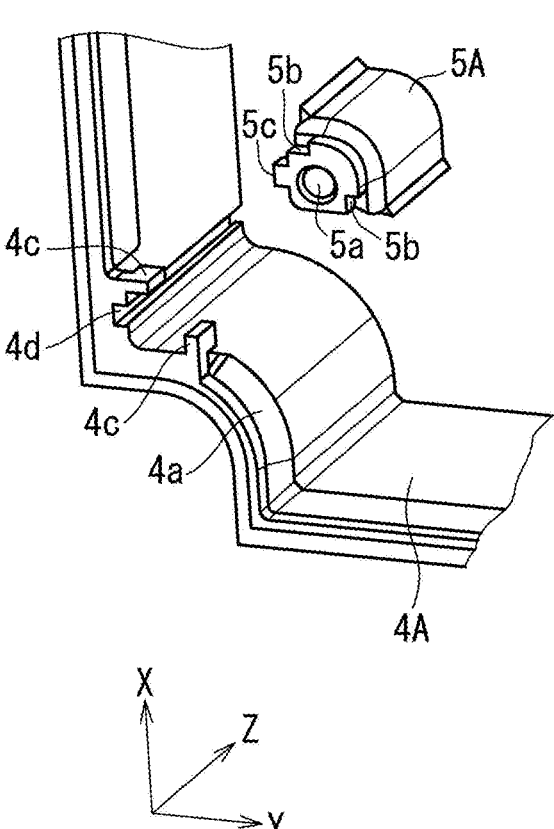
FIG. 9 is a perspective view of the bonded member before being attached to the resin case seen from the bottom surface side.

A semiconductor device according to an embodiment 2 is described next. FIG. 7 is an exploded perspective view of a semiconductor device according to the embodiment 2. FIG. 8 is an exploded perspective view of the semiconductor device according to the embodiment 2 seen from a bottom surface side (surface side in the −Z direction). FIG. 9 is a perspective view of the bonded member 5 before being attached to the resin case 4 seen from the bottom surface side (surface side in the −Z direction). FIG. 10 is a perspective view of the bonded member 5 attached to the resin case 4 seen from the bottom surface side (surface side in the −Z direction) and an enlarged view of a part surrounded by a solid line. In the description in the embodiment 2, the same reference numerals are assigned to the same constituent elements as those described in the embodiment 1, and the description thereof will be omitted.

As illustrated in FIG. 7 and FIG. 8, in the embodiment 2, the semiconductor device includes the heat radiation plate 1, the insulating substrate 2, the plurality of semiconductor elements 3, a resin case 4A, and four bonded members 5A.

As illustrated in FIG. 9 and FIG. 10, the resin case 4A includes a guide groove 4d extending in the up-down direction (Z axis direction) in addition to the structure of the resin case 4. The guide groove 4d is formed in a surrounding part of the pair of convex parts 4c in an inner peripheral surface of the resin case 4A. More specifically, the guide groove 4d is formed in a position adjacent to the convex parts 4c formed in a side of two sides extending in the X axis direction in the inner peripheral surface of the resin case 4A.

In the meanwhile, the bonded member 5A includes a guide convex part 5c fitted to the guide groove 4d so as to be movable along an extension direction of the guide groove 4d in addition to the structure of the bonded member 5. The guide convex part 5c is formed in a surrounding part of the concave part 5b in an outer peripheral part of the bonded member 5A. More specifically, the guide convex part 5c is formed in a position adjacent to the concave part 5b fitted to the convex part 4c on a side of two sides extending in the X axis direction in the outer peripheral part of the bonded member 5A.

Described next is a method of attaching the bonded member 5A to the resin case 4A. As illustrated in FIG. 9, the guide convex part 5c of the bonded member 5A is fitted to an upper end side (end side in the Z direction) of the guide groove 4d in the resin case 4A, and the bonded member 5A is moved along the extension direction of the guide groove 4d in this state.

As illustrated in FIG. 10, when the guide convex part 5c reaches a lower end (end in the −Z direction) of the guide groove 4d, the pair of concave parts 5b of the bonded member 5A are fitted to the pair of convex parts 4c of the resin case 4A, and the bonded member 5A is attached to the resin case 4A. Accordingly, the guide groove 4d and the guide convex part 5c are fitted to each other, and the pair of concave parts 5b are fitted to the pair of convex parts 4c in the state where the bonded member 5A is attached to the resin case 4A. That is to say, the resin case 4A and the bonded member 5A are fitted at three positions.

In the above description, the guide groove 4d and the guide convex part 5c are formed one by one in each of the resin case 4A and the bonded member 5A, but may also be formed two by two. In this case, the other guide groove 4d is formed in a position adjacent to the convex part 4c formed in a side of the curved part 4a in the inner peripheral surface of the resin case 4A. The other guide convex part 5c is formed in a position adjacent to the concave part 5b fitted to the convex part 4c on a side of the curved part 4a in the outer peripheral part of the bonded member 5A.

<Effect>

Accordingly, in the semiconductor device according to the embodiment 2, the guide groove 4d extending in the up-down direction (Z axis direction) is formed in the surrounding part of the convex part 4c in the inner peripheral surface of the resin case 4A, and the guide convex part 5c fitted to the guide groove 4d to be movable along the extension direction of the guide groove 4d is formed in the surrounding part of the concave part 5b in the outer peripheral part of the bonded member 5A.

Accordingly, the guide groove 4d functions as a guide at the time of attaching the bonded member 5A to the resin case 4A. The number of positions where the resin case 4A and the bonded member 5A are fitted is larger than that in the case of the embodiment 1, thus strength against torsion in attaching the screw 7 is increased.

Although the present disclosure is described above in detail, the foregoing description is in all aspects illustrative and does not restrict the disclosure. It is therefore understood that numerous modifications not exemplified can be devised.

Each embodiment can be arbitrarily combined, or each embodiment can be appropriately varied or omitted.

EXPLANATION OF REFERENCE SIGNS

1 heat radiation plate, 2 insulating substrate, 3 semiconductor element, 4, 4A resin case, 4c convex part, 4d guide groove, 5, 5A bonded member, 5a screw hole, 5b concave part, 5c guide convex part, 7 screw.

The invention claimed is:

1. A semiconductor device, comprising:
a heat radiation plate;
an insulating substrate disposed on an upper surface of the heat radiation plate;
a semiconductor element mounted to an upper surface of the insulating substrate;
a frame-like resin case disposed in a peripheral edge portion of the upper surface of the heat radiation plate and extending in an up-down direction to surround a lateral surface of each of the insulating substrate and the semiconductor element; and
a resin bonded member formed to be detachable from the resin case as a separate body separated from the resin case and bonded to the heat radiation plate while being attached to the resin case, wherein
formed in the bonded member is a screw hole to which a screw is screwed to bond the bonded member to the heat radiation plate.

2. The semiconductor device according to claim 1, wherein
the semiconductor element includes a wide bandgap semiconductor.

3. The semiconductor device according to claim 1, wherein
a convex part protruding to an inner periphery side is formed in an inner peripheral surface of the resin case, and
a concave part fitted to the convex part is formed in an outer peripheral part of the bonded member.

4. The semiconductor device according to claim 3, wherein
The semiconductor element includes a wide bandgap semiconductor.

5. The semiconductor device according to claim 3, wherein
a guide groove extending to an up-down direction is formed in a surrounding part of the convex part in the inner peripheral surface of the resin case, and
a guide convex part fitted to the guide groove to be movable along an extension direction of the guide groove is formed in a surrounding part of the concave part in the outer peripheral part of the bonded member.

6. The semiconductor device according to claim 5, wherein

The semiconductor element includes a wide bandgap semiconductor.

7. A method of manufacturing a semiconductor device for manufacturing the semiconductor device according to claim 1, comprising:

(a) molding the resin case;

(b) molding the bonded member as a separate body separated from the resin case;

(c) forming the screw hole in the bonded member by machine processing;

(d) attaching the bonded member to the resin case; and (e) bonding the heat radiation plate and the bonded member by the screw, thereby bonding the heat radiation plate and the resin case.

* * * * *